(12) United States Patent
Ryat

(10) Patent No.: US 8,471,628 B2
(45) Date of Patent: Jun. 25, 2013

(54) AMPLIFIER WITH REDUCED OUTPUT TRANSIENTS AND METHOD THEREFOR

(75) Inventor: Marc Henri Ryat, Fenouillet (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 139 days.

(21) Appl. No.: 13/120,143

(22) PCT Filed: Oct. 21, 2008

(86) PCT No.: PCT/US2008/080626
§ 371 (c)(1),
(2), (4) Date: Mar. 21, 2011

(87) PCT Pub. No.: WO2010/047689
PCT Pub. Date: Apr. 29, 2010

(65) Prior Publication Data
US 2011/0193634 A1    Aug. 11, 2011

(51) Int. Cl.
*H03F 1/14* (2006.01)
(52) U.S. Cl.
USPC .............................. 330/51; 330/296; 330/310
(58) Field of Classification Search
USPC ............................ 330/51, 296, 310; 381/94.5
See application file for complete search history.

(56) References Cited

U.S. PATENT DOCUMENTS

| | | | |
|---|---|---|---|
| 4,516,082 A | 5/1985 | Smith et al. | |
| 5,642,074 A | 6/1997 | Ghaffaripour et al. | |
| 5,703,529 A | 12/1997 | Ghaffaripour et al. | |
| 5,939,938 A | 8/1999 | Kalb et al. | |
| 6,255,904 B1 | 7/2001 | Capodivacca et al. | |
| 6,346,854 B1 | 2/2002 | Heithoff | |
| 6,411,531 B1 | 6/2002 | Nork et al. | |
| 6,573,787 B2 | 6/2003 | Ikin | |
| 7,053,704 B2 | 5/2006 | Forel et al. | |
| 7,061,327 B2 | 6/2006 | Doy | |
| 7,061,328 B2 | 6/2006 | Doy | |
| 7,362,179 B2 * | 4/2008 | Liu et al. | 330/296 |
| 7,378,904 B2 * | 5/2008 | Risbo | 330/10 |
| 7,446,603 B2 * | 11/2008 | Wong et al. | 330/10 |
| 7,532,066 B1 * | 5/2009 | Struble et al. | 330/51 |
| 7,990,212 B1 * | 8/2011 | Tsang | 330/51 |
| 8,139,792 B2 * | 3/2012 | Magrath | 381/120 |
| 8,260,224 B2 * | 9/2012 | Doherty et al. | 455/127.1 |

(Continued)

FOREIGN PATENT DOCUMENTS

| | | |
|---|---|---|
| EP | 1229639 | 8/2002 |
| EP | 1689075 | 8/2006 |
| EP | 1879290 | 1/2008 |

*Primary Examiner* — Patricia Nguyen
(74) *Attorney, Agent, or Firm* — Polansky & Associates, P.L.L.C.; Paul J. Polansky

(57) ABSTRACT

An amplifier (210) includes an input stage (310, 320) and an output stage (330). The input stage (310, 320) has an input for receiving an input signal, and an output. The output stage (330) has an input coupled to the output of the input stage (310, 320), and an output for providing an amplified output signal. The output stage (330) includes a gain stage and a bias circuit. The gain stage has an input forming the input of the output stage, an output for providing the amplified output signal, and a first bias terminal. The bias circuit has a first output terminal coupled to the first bias terminal of the gain stage. During a turn-on period the bias circuit gradually ramps the first bias terminal from a first initial voltage to a first bias voltage.

22 Claims, 10 Drawing Sheets

U.S. PATENT DOCUMENTS

| | | |
|---|---|---|
| 2002/0130705 A1 | 9/2002 | Meng et al. |
| 2007/0096819 A1 | 5/2007 | Yamamoto et al. |
| 2007/0223741 A1 | 9/2007 | Seaberg |
| 2007/0229163 A1 * | 10/2007 | Berkhout ............ 330/285 |
| 2007/0229169 A1 | 10/2007 | Doy et al. |
| 2008/0089533 A1 | 4/2008 | Theus et al. |

* cited by examiner

AMPLIFIER WITH REDUCED OUTPUT TRANSIENTS AND METHOD THEREFOR

FIELD OF THE DISCLOSURE

The present disclosure relates generally to amplifiers, and more particularly relates to transient suppression in amplifiers.

BACKGROUND

Amplifiers, such as audio amplifiers, can produce an undesired output transient signal when operating power or biasing is initially applied to the amplifier, and when power or biasing is removed from the amplifier. A transient signal, commonly referred to as a transient, is typically a spurious sudden pulse of voltage or current of brief duration. The transient may result from many situations, such as a voltage differential on coupling capacitors, circuit imbalances at or within a stage of the amplifier, and abrupt changes in reference voltages. The transients, commonly known as "clicks" or "pops," may be audibly disturbing to a listener, and can be harmful to output circuitry of the amplifier and to an attached loudspeaker or other electro-acoustical load device.

Techniques have been developed to attempt to prevent or suppress spurious transients, but may fail to address all sources of the transients. Such techniques may attenuate an audible consequence of the transient, but fail to protect all portions of the audio system from damage. These techniques typically include a delay element and a switch used to temporarily limit the gain of the amplifier or isolate the output of the amplifier from a connected load device. Transients can be problematic in any type of amplifier, such as audio amplifiers, radio frequency amplifiers, and industrial and scientific instrumentation amplifiers.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

Figure 1:
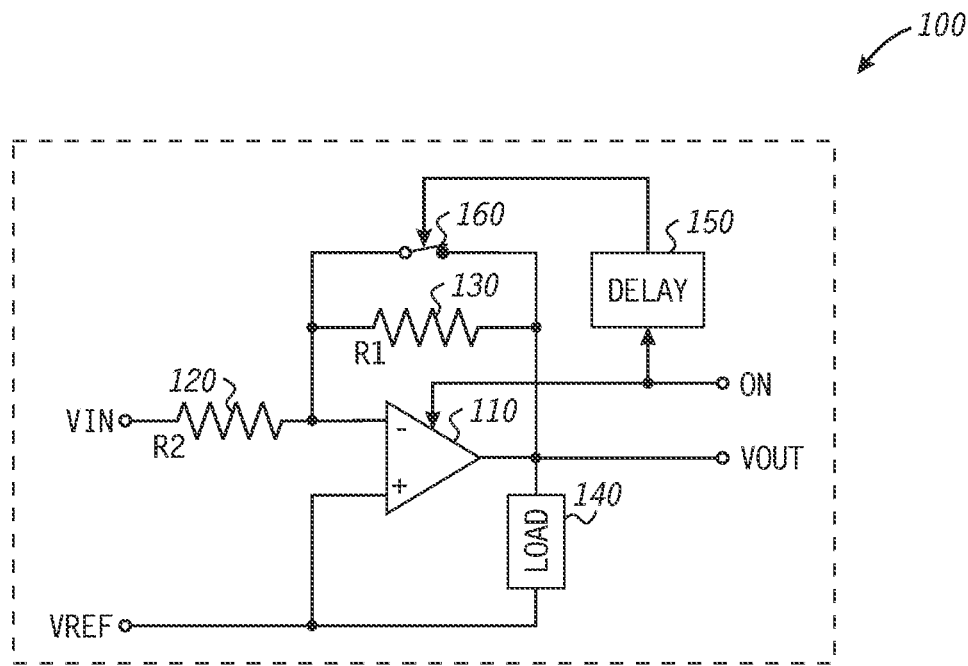
FIG. 1 illustrates in partial block diagram and partial schematic form an audio amplifier circuit including a conventional transient suppression method as previously known.

FIG. 1 illustrates in partial block diagram and partial schematic form an audio amplifier circuit 100 including a conventional transient suppression method as previously known. Audio amplifier circuit 100 includes an audio amplifier 110, a resistor 120, labeled "R2," a resistor 130, labeled "R1," a load 140, labeled "LOAD," a delay element 150, and a switch 160. Audio amplifier 110 has an inverting input, a non-inverting input to receive a reference signal, labeled "VREF," an output to provide a signal labeled "VOUT," and a power control input terminal to receive a signal labeled "ON." Resistor 120 has a first terminal to receive an input signal, labeled "VIN," and a second terminal connected to the inverting input of audio amplifier 110. Resistor 130 has a first terminal connected to the inverting input of audio amplifier 110 and a second terminal connected to the output of audio amplifier 110. Load 140 has a first terminal connected to the output of audio amplifier 110, and a second terminal that also receives signal VREF. Switch 160 has a first terminal connected to the inverting input of audio amplifier 110, a second terminal connected to the output of audio amplifier 110, and a control terminal. Delay element 150 has an input to receive signal ON, and an output connected to the control terminal of switch 160.

Audio amplifier circuit 100 is configured to receive signal VIN, and provide signal VOUT to load 140, such as a loudspeaker. Signal VOUT is harmonically substantially identical to signal VIN, but the voltage level of signal VOUT is adjusted relative to the voltage level of VIN by the equation:

$$VOUT = VREF - \frac{R1}{R2}(VIN - VREF)$$

where R1 represents the value of resistor 130, in ohms, R2 represents the value of resistor 120, in ohms, VREF represents the voltage level of signal VREF, VIN represents the voltage level of input signal VIN, and VOUT represents the voltage level of signal VOUT. The ratio of the voltage level of signal VOUT compared to the voltage level of signal VIN is referred to as the gain of audio amplifier circuit 100. Audio amplifier circuit 100 is referred to as a negative-feedback amplifier.

When operating power is initially applied to audio amplifier 110 by asserting signal ON, audio amplifier 110 can generate spurious transients at signal VOUT. These transients may be heard as clicks or pops at load 140. A conventional technique to suppress transients is to incorporate and configure delay element 150 and switch 160 such that switch 160 remains closed for a predetermined interval of time following the assertion of signal ON. While switch 160 is closed, the terminals of resistor 130 are shorted together, and the gain of audio amplifier circuit 100 is thus set to zero. The duration of the time interval provided by delay element 150 is configured to be greater than the amount of time that transients are potentially generated. After the delay interval has elapsed, switch 160 is opened so that the gain of audio amplifier circuit 100 is configured by the previously described equation.

The use of a delay element and a switch alone to control the gain of an amplifier, and related techniques, may not be fully effective at eliminating undesired transients at the output of an amplifier when operating power is applied. For example, the abrupt opening or closing of switches, such as switch 160, can also result in the generation of spurious transients. Furthermore, even with a switch closed around the amplifier, transients can also be generated when operating power is applied or removed from the amplifier, and prior art techniques usually require additional circuitry for actual transient suppression. These typically include controlling the delay element by a comparator, itself driven by the output of the amplifier and by a reference voltage during the turn-on or turn-off phase.

Another conventional transient suppression technique makes use of a delay element and a switch to temporarily disconnect a load from the output of an amplifier when operating power is applied. This technique may not protect potential high power devices in the output stage of the audio amplifier from excessive current that may result from transients. It may also require switch elements of an impractically large size for its implementation.

Figure 2:
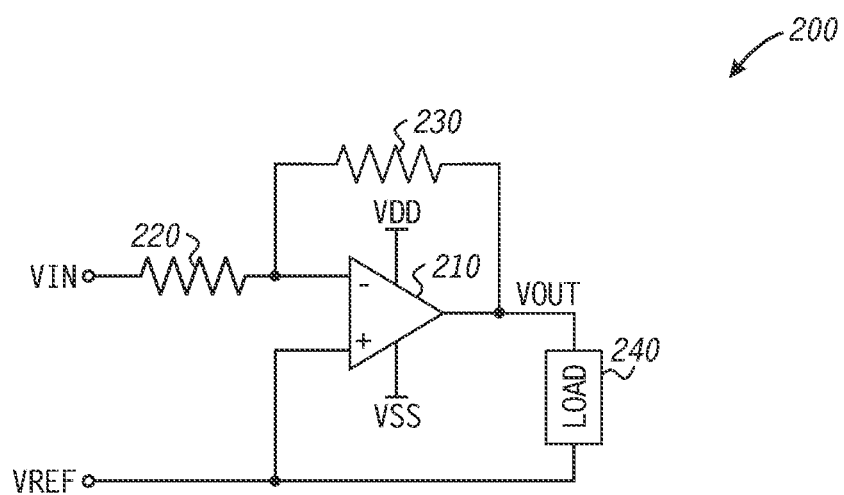
FIG. 2 illustrates in partial block diagram and partial schematic form an audio amplifier circuit according to the present invention.

FIG. 2 illustrates in partial block diagram and partial schematic form an audio amplifier circuit 200 according to the present invention. Audio amplifier circuit 200 includes an audio amplifier 210, resistors 220 and 230, and a load 240, labeled "LOAD." Audio amplifier 210 has an inverting input, a non-inverting input to receive a reference signal, labeled "VREF," an output to provide a signal labeled "VOUT," and two terminals to receive operating power, labeled "VDD" and "VSS," respectively. Resistor 220 has a first terminal to receive an input signal, labeled "VIN," and a second terminal connected to the inverting input of audio amplifier 210. Resistor 230 has a first terminal connected to the inverting input of audio amplifier 210 and a second terminal connected to the output of audio amplifier 210. Load 240 has a first terminal connected to the output of audio amplifier 210, and a second terminal that also receives signal VREF.

The operation of audio amplifier circuit 200 is similar to the operation of audio amplifier circuit 100 of FIG. 1, except that audio amplifier circuit 200 does not merely consist of a delay element and a switch that implements the conventional transient suppression technique described with reference to FIG. 1. Instead, transient suppression circuitry is integrated within audio amplifier 210. The construction and operation of audio amplifier circuit 210 will now be further described with reference to FIGS. 3-17.

Figure 3:
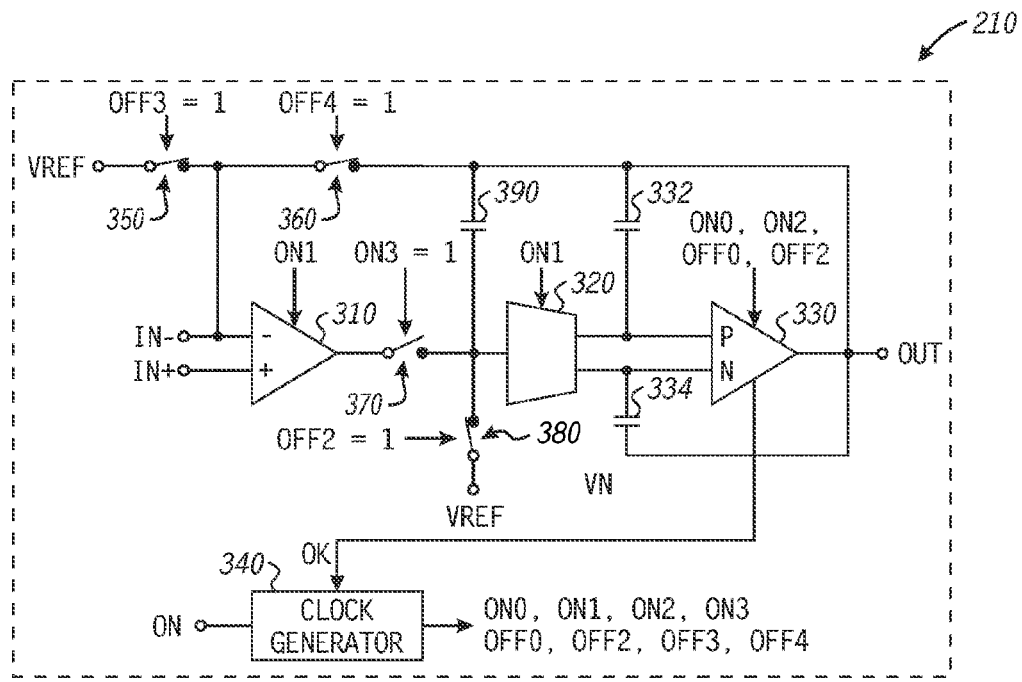
FIG. 3 illustrates in partial block diagram and partial schematic form, an audio amplifier, such as the amplifier of FIG. 2.

FIG. 3 illustrates in partial block diagram and partial schematic form, audio amplifier 210 of FIG. 2. An amplifier often includes multiple stages, and each stage is designed to address particular product goals. For example, an input gain stage may be designed to maximize input impedance and/or to minimize input noise, and an output stage may be designed to efficiently source relatively high signal current to a low impedance load device. An intermediate transconductance stage may be beneficial to drive the high power output gain stage while minimizing distortion.

Audio amplifier 210 includes a gain stage 310, a transconductance stage 320, an output stage 330, a clock generator circuit 340, switches 350, 360, 370, and 380, and capacitors 332, 334, and 390. Gain stage 310 has a non-inverting input to receive a signal labeled "IN-," an inverting input to receive a signal labeled "IN+," an output, and a control input to receive a signal labeled "ON1." Transconductance stage 320 has an input, a first output, a second output, and a control input to receive signal ON1. Output stage 330 has a P input connected to the first output of transconductance stage 320, an N input connected to the second output of transconductance stage 320, a first output to provide a signal labeled "OUT," a second output to provide a signal labeled "OK," and a control input to receive signals labeled "ON0," "ON2," "OFF0," and "OFF2."

Switch 350 has a first terminal to receive a signal labeled "VREF," a second terminal connected to the non-inverting input of gain stage 310, and a control input to receive a signal labeled "OFF3." Switch 360 has a first terminal connected to the second terminal of switch 350, a second terminal connected to the output of output stage 330, and a control input to receive a signal labeled "OFF4." Switch 370 has a first terminal connected to the output of gain stage 310, a second terminal connected to the input of transconductance stage 320, and a control input to receive a signal labeled "ON3." Switch 380 has a first terminal connected to the input of transconductance stage 320, a second terminal to receive signal VREF, and a control input to receive signal OFF2.

Capacitor 332 has a first input connected to the P input of output stage 330 and a second terminal connected to the output of output stage 330. Capacitor 334 has a first input connected to the N input of output stage 330 and a second terminal connected to the output of output stage 330. Capacitor 390 has a first terminal connected to the output of output stage 330 and a second terminal connected to the input of transconductance stage 320. Clock generator circuit 340 has a first input to receive a signal labeled "ON," a second input to receive signal OK, and an output to provide control signals ON0, ON1, ON2, ON3, OFF0, OFF2, OFF3, and OFF4.

Gain stage 310 is a voltage amplifier with a differential input and a single-ended output. Input signal IN+ represents the primary input to audio amplifier 210 to receive an audio signal. Gain stage 310 includes power supply terminals to receive operating voltages VDD and VSS (not shown). Gain stage 310 is enabled when signal ON1 is asserted. A signal is considered asserted when it is set to a voltage potential corresponding to a true state. A signal is considered negated when it is set to a voltage potential corresponding to a false state. For positive logic signals, such as ON1, the true state corresponds to a logic high voltage and a false state corresponds to a logic low voltage. Transconductance stage 320 is an operational transconductance amplifier with a differential input and a differential output. To interface with gain stage 310, one input of the differential input is connected to output of gain stage 310, and the other input (not shown in FIG. 3) receives a reference voltage. In an alternate embodiment, transconductance stage 320 may be implemented with a single-ended input. Transconductance stage 320 also includes power supply terminals to receive operating voltages VDD and VSS (not shown). Transconductance stage 320 is enabled when signal ON1 is asserted. Gain stage 310 and transconductance stage 320 together form an input stage.

Output stage 330 includes a class AB gain stage and a bias circuit. A class AB gain stage is characterized by power transfer devices designed to minimize crossover distortion that can occur in a class B output stage, while operating with improved power efficiency compared to that provided by a class A output stage. A bias circuit disclosed herein provides bias voltages to the output stage and the bias voltages are gradually ramped from initial voltages to respective operational bias voltage levels during a turn-on period, and gradually ramped back to the respective initial voltage levels during a turn-off period. As used herein, "gradually ramping" means changing a signal from one level to another level intentionally over an extended period of time. In the context of an audio amplifier, for example, one may select the extended period of time to be long enough to suppress audible clicks and pops by a desired amount. In the particular embodiment described herein, output stage 330 uses the charging and discharging times of capacitors to intentionally extend the period of time over which bias voltages change from initial to operational voltage levels and vice versa. Output stage 330 also includes power supply terminals (not shown) to receive operating voltages VDD and VSS. Output stage 330 receives control signals ON0, ON2, OFF0, and OFF2, which are used to control the bias circuit. Output stage 330 provides signal OK to clock generator circuit 340 when the bias circuit has completed ramping to the operational bias voltage level.

Capacitors 332, 334, and 390 are referred to as Miller capacitors or compensation capacitors and are primarily included to stabilize or compensate audio amplifier 210 at frequencies above the audio spectrum.

Clock generator circuit 340 receives signal ON, which is asserted to configure audio amplifier 210 for operation, and negated when it is desired to disable operation of audio amplifier 210. The assertion and negation of signal ON configures clock generator circuit 340 to provide control signals ON0, ON1, ON2, ON3, OFF0, OFF2, OFF3, and OFF4. The assertion and negation of the control signals configure switches 350, 360, 370, and 380, and stages 310, 320, and 330, as will be described more fully below.

Figure 4:
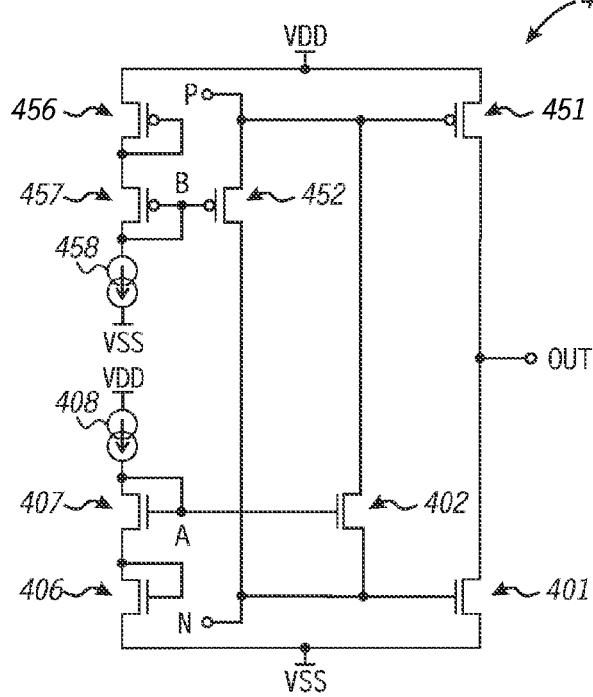
FIG. 4 illustrates in schematic form a conventional class AB output stage as previously known.

FIG. 4 illustrates in schematic form a conventional class AB output stage 400, as previously known. Output stage 400 includes n-channel transistors 401, 402, 406, 407, p-channel transistors 451, 452, 456 and 457, and current sources 408 and 458. Transistor 401 has a source connected to a power supply voltage terminal labeled "VSS," a gate connected to a node labeled "N," and a drain connected to a node labeled "OUT." Transistor 451 has a source connected to a power supply voltage terminal labeled "VDD," a gate connected to a node labeled "P," and a drain connected to node OUT. Transistor 402 has a first source/drain (S/D) terminal connected to node N, a gate connected to a node labeled "A," and a second S/D terminal connected to node P. Transistor 452 has a first S/D terminal connected to node P, a gate connected to a node labeled "B," and a second S/D terminal connected to node N. Transistor 406 has a source connected to VSS, a gate, and a drain connected to its gate. Transistor 407 has a source connected to the drain of transistor 406, a gate connected to node A, and a drain also connected to node A. Current source 408 has a first terminal connected to node A, and a second terminal connected to VDD. Transistor 456 has a source connected to VDD, a gate, and a drain connected to its gate. Transistor 457 has a source connected to the drain of transistor 456, a gate connected to node B, and a drain also connected to node B. Current source 458 has a first terminal connected to node B, and a second terminal connected to VSS.

The operation of class AB output stage is well understood to those familiar with amplifier circuits. A pair of input signals is received at nodes P and N, and an output signal is provided at node OUT. Transistors 401 and 451 are arranged in a push-pull configuration and conduct current that is delivered to a load device, such as a loudspeaker (not shown), that may be connected to node OUT. Transistors 406 and 407 are configured as diodes to provide a fixed bias voltage at node A. Transistors 456 and 457 are configured as diodes to provide a fixed bias voltage at node B. The conductivity of transistor 401 is modulated by the input signal provided to node N, and the conductivity of transistor 451 is modulated by the input signal provided to node P. Transistors 402 and 452 clamp the voltage at nodes N and P, respectively, relative to nodes A and B, such that neither of transistors 401 and 402 completely turn off.

Figure 5:
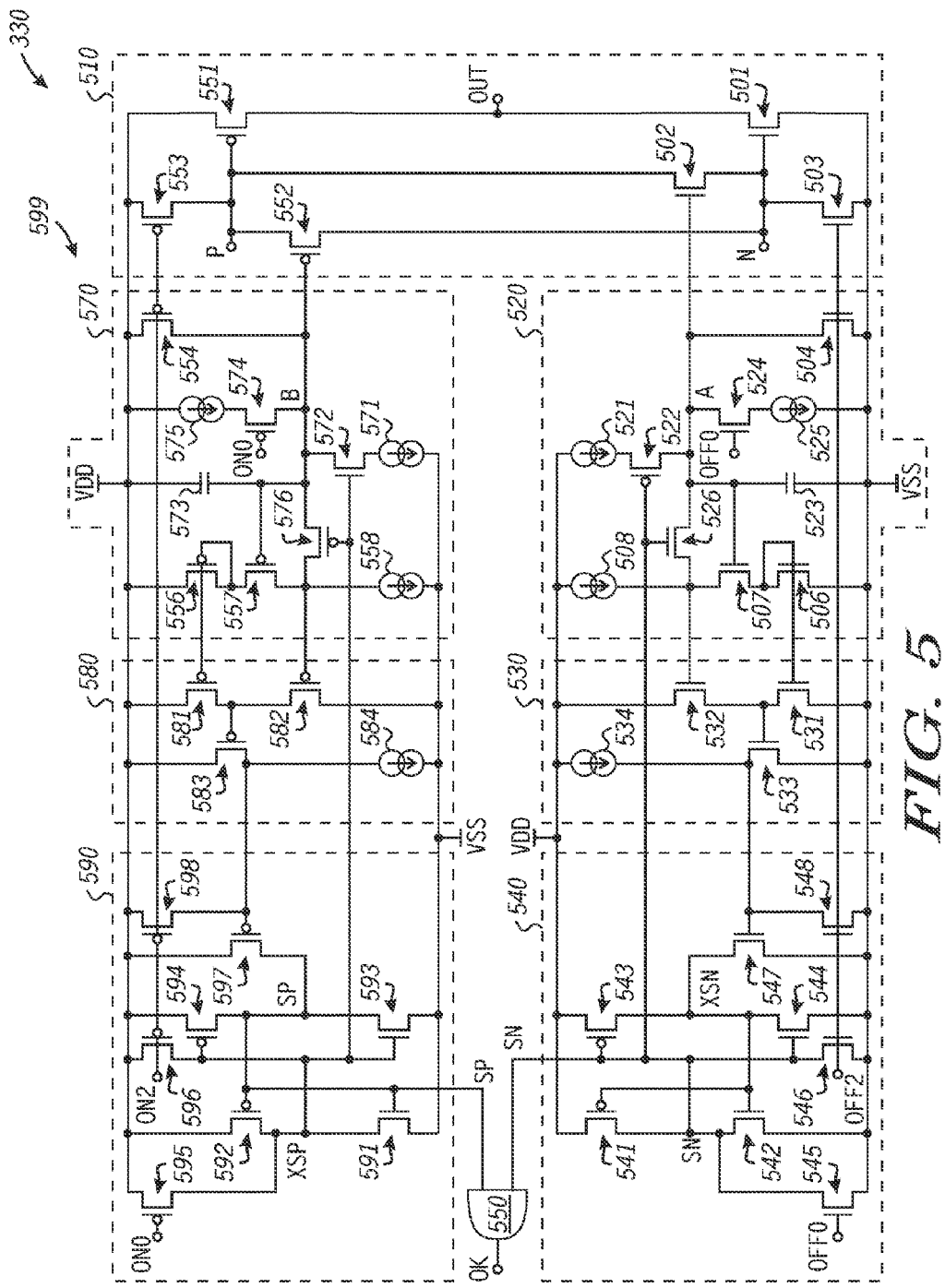
FIG. 5 illustrates in schematic form the output stage of FIG. 3.

FIG. 5 illustrates in schematic form output stage 330 of FIG. 3. Output stage 330 generally includes a gain stage 510, ramp stages 520 and 570, comparator circuits 530 and 580, latches 540 and 590, and an AND gate 550. Output stage 330 receives input signals at nodes labeled "N," and "P," and provides an output signal at a node labeled "OUT."

Gain stage 510 includes n-channel transistors 501, 502, 503, and p-channel transistors 551, 552, and 553. Transistor 501 has a source connected to VSS, a gate connected to a node N, and a drain connected to a node OUT. Transistor 551 has a source connected to VDD, a gate connected to a node P, and a drain connected to node OUT. Transistor 502 has a first S/D terminal connected to node N, a gate connected to a node labeled "A," and a second S/D terminal connected to node P. Transistor 552 has a first S/D terminal connected to node P, a gate connected to a node labeled "B," and a second S/D terminal connected to node N. Transistor 503 has a source connected to VSS, a gate to receive signal OFF2, and a drain connected to node N. Transistor 553 has a source connected to VDD, a gate to receive signal ON2, and a drain connected to node P.

Ramp stage 520 includes n-channel transistors 504, 506, 507, 524, and 526, p-channel transistor 522, current sources 508, 521, and 525, and a capacitor 523. Transistor 506 has a source connected to VSS, a gate, and a drain connected to its gate. Transistor 507 has a source connected to the drain of transistor 506, a gate connected to node A, and a drain, Current source 508 has a first terminal connected to the drain of transistor 507, and a second terminal connected to VDD. Transistor 526 has a first S/D terminal connected to the drain of transistor 507, a gate connected to a node labeled "SN," and a second S/D terminal connected to node A. Current source 521 has a first terminal connected to VDD, and a second terminal. Transistor 522 has a source connected to the second terminal of current source 521, a gate connected to node SN, and a drain connected to node A. Capacitor 523 has a first terminal connected to node A, and a second terminal connected to VSS. Current source 525 has a first terminal connected to VSS, and a second terminal. Transistor 524 has a source connected to the second terminal of current source 525, a gate to receive signal OFF0, and a drain connected to node A. Transistor 504 has a source connected to VSS, a gate to receive signal OFF 2, and a drain connected to node A.

Ramp stage 570 includes p-channel transistors 554, 556, 557, 574, and 576, re-channel transistor 572, current sources 558, 571, and 575, and a capacitor 573. Transistor 556 has a source connected to VDD, a gate, and a drain connected to its gate. Transistor 557 has a source connected to the drain of transistor 556, a gate connected to node B, and a drain. Current source 558 has a first terminal connected to the drain of transistor 557, and a second terminal connected to VSS. Transistor 576 has a first S/D terminal connected to the drain of transistor 557, a gate connected to a node labeled "XSP," and a second S/D terminal connected to node B. Current source 571 has a first terminal connected to VSS, and a second terminal. Transistor 572 has a source connected to the second terminal of current source 571, a gate connected to node XSP, and a drain connected to node B. Capacitor 573 has a first terminal connected to node B, and a second terminal connected to VDD. Current source 575 has a first terminal connected to VDD, and a second terminal. Transistor 574 has a source connected to the second terminal of current source 575, a gate connected to receive signal ON0, and a drain connected to node B. Transistor 554 has a source connected to VDD, a gate to receive signal ON2, and a drain connected to node B.

Comparator circuit 530 includes n-channel transistors 531, 532, and 533, and current source 534. Transistor 533 has a source connected to VSS, a gate, and a drain. Current source 534 has a first terminal to the drain of transistor 533, and a second terminal connected to VDD. Transistor 531 has a source connected to VSS, a gate connected to the gate of transistor 506, and a drain connected to the gate of transistor 533. Transistor 532 has a source connected to the drain of transistor 531, a gate connected to the drain of transistor 507, and a drain connected to VDD.

Comparator circuit 580 includes p-channel transistors 581, 582, and 583, and current source 584. Transistor 583 has a source connected to VDD, a gate, and a drain. Current source 584 has a first terminal connected to the drain of transistor 583, and a second terminal connected to VSS. Transistor 581 has a source connected to VDD, a gate connected to the gate of transistor 556, and a drain connected to the gate of transistor 583. Transistor 582 has a source connected to the drain of transistor 581, a gate connected to the drain of transistor 557, and a drain connected to VSS.

Latch 540 includes p-channel transistors 541 and 543, and n-channel transistors 542, 544, 545, 546, 547, and 548. Transistor 545 has a source connected to VSS, a gate to receive signal OFF0, and a drain connected to node SN. Transistor 542 has a source connected to VSS, a gate connected to a node labeled "XSN", and a drain connected to node SN. Transistor 541 has a source connected to VDD, a gate connected to node XSN, and a drain connected to node SN. Transistor 546 has a source connected to VSS, a gate to receive signal OFF2, and a drain connected to node SN. Transistor 544 has a source connected to VSS, a gate connected to node SN, and a drain connected to node XSN. Transistor 543 has a source connected to VDD, a gate connected to node SN, and a drain connected to node XSN. Transistor 547 has a source connected to VSS, a gate connected to the drain of transistor 533, and a drain connected to node XSN. Transistor 548 has a source connected to VSS, a gate to receive signal OFF2, and a drain connected to the gate of transistor 547.

Latch 590 includes n-channel transistors 591 and 593, and p-channel transistors 592, 594, 595, 596, 597, and 598. Transistor 595 has a source connected to VDD, a gate to receive signal ON0, and a drain connected to node XSP. Transistor 592 has a source connected to VDD, a gate connected to a node labeled "SP", and a drain connected to node XSP. Transistor 591 has a source connected to VSS, a gate connected to node SP, and a drain connected to node XSP. Transistor 596 has a source connected to VDD, a gate to receive signal ON2, and a drain connected to node XSP. Transistor 594 has a source connected to VDD, a gate connected to node XSP, and a drain connected to node SP. Transistor 593 has a source connected to VSS, a gate connected to node XSP, and a drain connected to node SP. Transistor 597 has a source connected to VDD, a gate connected to the drain of transistor 583, and a drain connected to node SP. Transistor 598 has a source connected to VDD, a gate to receive signal ON2, and a drain connected to the gate of transistor 597.

AND gate 550 has a first input connected to node SN, a second input connected to node SP, and an output to provide signal OK.

Gain stage 510 includes transistors 501 and 551, which are arranged in a class AB push-pull configuration and conduct current that is delivered to a load device, such as a loudspeaker (not shown), that receives signal OUT. Transistors 501 and 551 are similar to transistors 401 and 451 of FIG. 4. Transistors 502 and 552 are arranged in a source-follower configuration similar to transistors 402 and 452 of FIG. 4. An initialization procedure (turn-on sequence) is performed when output stage 330 is activated, and a corresponding shutdown procedure (turn-off sequence) is performed when output stage 330 is subsequently deactivated. During initialization of output stage 330, bias voltages at the bias terminals (nodes A and B) are gradually ramped from initial voltages to respective operating bias voltages. During shutdown of output stage 330, bias voltages are gradually ramped from operating bias voltage levels back to respective initial voltages. The turn-on and turn-off sequences are configured by clock generator circuit 340 of FIG. 3, and described with reference to FIG. 6.

Figure 6:
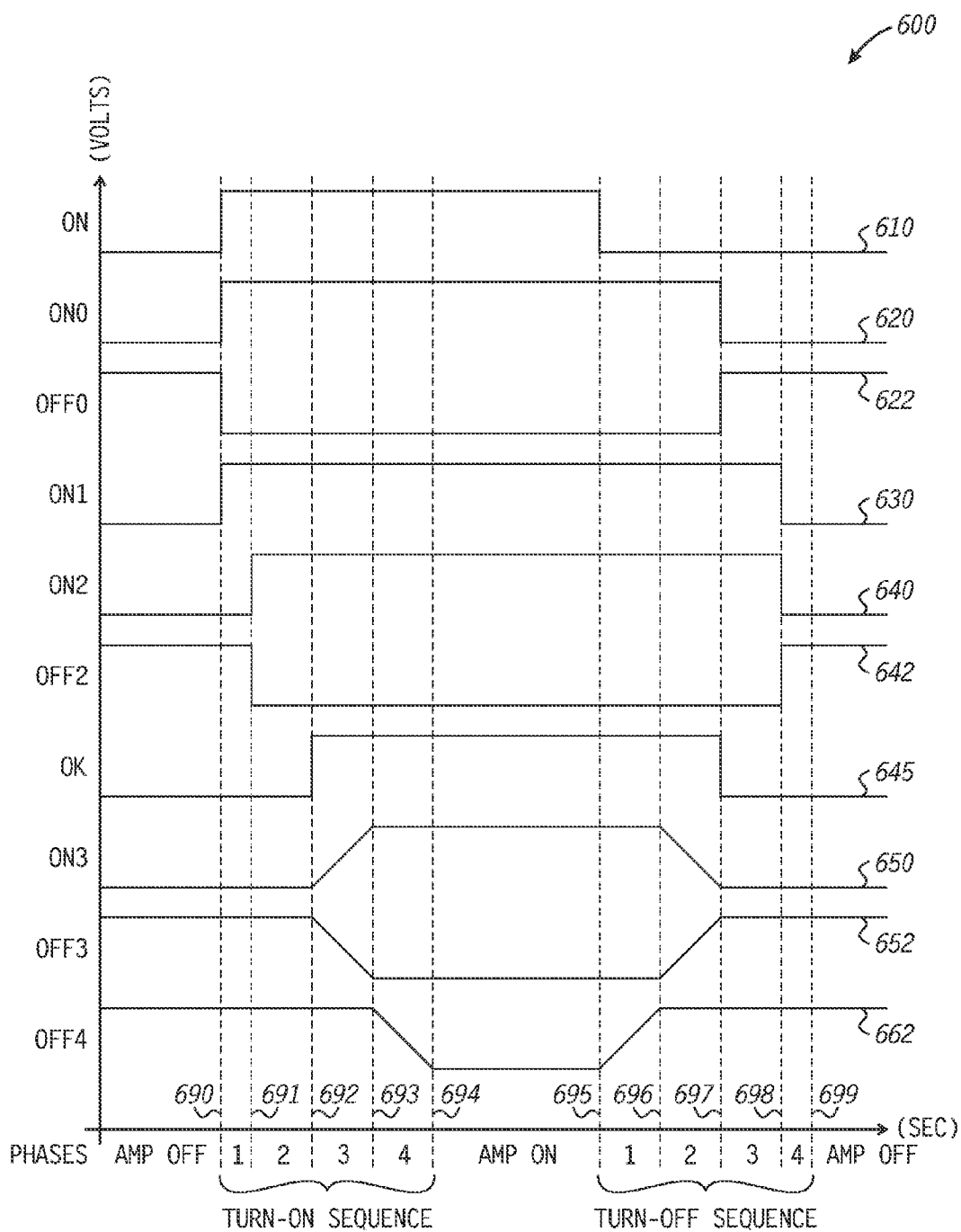
FIG. 6 is a timing diagram illustrating control signals provided by a clock generator circuit of FIG. 3.

FIG. 6 is a timing diagram 600 illustrating control signals provided by clock generator circuit 340 of FIG. 3. Timing diagram 600 includes a horizontal axis representing time expressed in seconds, and a vertical axis representing voltage, expressed in volts, relative to each of ten waveforms. Timing diagram 600 includes waveforms 610, 620, 622, 630, 640, 642, 645, 650, 652, and 662, and time references 690, 691, 692, 693, 694, 695, 696, 697, 698, and 699. Intervals of time are labeled indicating particular phases of operation, including "AMP OFF," "TURN-ON SEQUENCE" phases "1," "2," "3," and "4," "AMP ON," "TURN-OFF SEQUENCE" phases "1," "2," "3," and "4," and "AMP OFF."

Phase AMP OFF is the interval of time prior to time reference 690, and following time reference 699. The TURN-ON SEQUENCE includes phase 1 between time references 690 and 691, phase 2 between time references 691 and 692, phase 3 between time references 692 and 693, and phase 4 between time references 693 and 694. The TURN-OFF SEQUENCE includes phase 1 between time references 695 and 696, phase 2 between time references 696 and 697, phase 3 between time references 697 and 698, and phase 4 between time references 698 and 699.

Waveform 610 represents signal ON received by clock generator circuit 340, and transitions from a logic-low value to a logic-high value (high) at time reference 690, and transitions back to a logic-low value (low) at time reference 695. Signal ON is asserted to initiate a turn-on sequence of audio amplifier 210, and negated to initiate a turn-off sequence. For example, signal ON may represent a user-operated switch that is intended to activate audio amplifier 210.

Waveform 620 represents signal ON0 provided by clock generator circuit 340, and transitions high at time reference 690 in response to the assertion of signal ON, and transitions back low at time reference 697. Waveform 622 represents signal OFF0 provided by clock generator circuit 340, and transitions low at time reference 690, and transitions back high at time reference 697. Signal OFF0 is the logical inverse of signal ON0.

Waveform 630 represents signal ON1 provided by clock generator circuit 340, and transitions high at time reference 690 in response to the assertion of signal ON, and transitions back low at time reference 698. Waveform 640 represents signal ON2 provided by clock generator circuit 340, and transitions high at time reference 691, and transitions back low at time reference 698. Waveform 642 represents signal OFF2 provided by clock generator circuit 340, and transitions low at time reference 691, and transitions back high at time reference 698. Signal OFF2 and is the logical inverse of signal ON2.

Waveform 645 represents signal OK provided by output stage 330 at node OK, and transitions high at time reference 692, and transitions back low at time reference 697.

Waveform 650 represents signal ON3 provided by clock generator circuit 340, and transitions in a ramping manner from a logic-low value beginning at time reference 692 to a logic-high value at time reference 693, and transitions in a ramping manner from a logic-high value beginning at time reference 696 to a logic-low value at time reference 697. Waveform 652 represents signal OFF3 provided by clock generator circuit 340, and transitions in a ramping manner from a logic-high value beginning at time reference 692 to a logic-low value at time reference 693, and transitions in a ramping manner from a logic-low value beginning at time reference 696 to a logic-high value at time reference 697. Signal OFF3 is the inverse of signal ON3.

Waveform 662 represents signal OFF4 provided by clock generator circuit 340, and transitions in a ramping manner from a logic-high value beginning at time reference 693 to a logic-low value at time reference 694, and transitions in a ramping manner from a logic-low value beginning at time reference 695 to a logic-high value at time reference 696.

The control signals provided by clock generator circuit 340 configure the switches illustrated at FIG. 3, and configure the operation of voltage gain stage 310, transconductance stage 320, and output stage 330. The turn-on and turn-off sequence is more particularly described with reference to FIGS. 7-19. Whereas linear ramping of signals ON3, OFF3, and OFF4 is illustrated, non-linear ramping can also be provided. The rate that a signal is ramped can be adjusted to meet the desired operating behavior of a particular amplifier.

Referring back to FIG. 5, transistors 503, 504, 553, and 555 are configured by the assertion of signal OFF2 and the corresponding negation of signal ON2 to inhibit conduction of transistors 501 and 551. Prior to the assertion of signal ON, signals OFF0 and OFF2 are high, which resets latch 540 by turning on transistors 545, 546, and 548. Similarly, signals ON0 and ON2 are low, which resets latch 590 by turning on transistors 595, 596, and 598. While either of latches 540 and 590 is in the reset state, signal OK is negated. Furthermore, node A is held at the potential of VSS by transistor 504, and node B is held at the potential of VDD by transistor 554.

In response to the assertion of signal ON, clock generation circuit 340 negates signal OFF0 and asserts signal ON0 at time reference 690, turning off transistors 504 and 554. At time reference 691, signal ON2 is asserted and signal OFF2 is negated, which allows current source 521 to begin charging capacitor 523 via transistor 522. Similarly, current source 571 begins charging capacitor 573 via transistor 572. The properties of current source 521 and transistor 522 are selected so that the charge on capacitor 523, and thus the voltage at node A, ramps gradually towards the potential of VDD over a predetermined interval of time. Similarly, the values of current source 571 and transistor 572 are selected so that the charge on capacitor 573, and the voltage at node B, gradually ramps towards the potential of VSS at a rate substantially equal to the charging rate of capacitor 523.

When the voltage at node A has increased to a suitable level, transistor 533 of comparator circuit 530 is turned off. This allows current source 534 to pull the node connected to the gate of transistor 547 to VDD, which turns on transistor 547. Thus, node XSN is brought to the potential of VSS and latch 540 is set. Similarly, when the voltage at node B has decreased to a suitable level, transistor 583 of comparator circuit 580 is turned off. This allows current source 584 to pull the node connected to the gate of transistor 597 to VSS, which turns on transistor 597. Thus, node SP is brought to the potential of VDD and latch 590 is set. When both latches 540 and 590 have been set, nodes SN and SP are both at a logic-high potential, and AND gate 550 asserts signal OK.

Once latch 540 is set, transistor 526 is turned on and transistor 522 is turned off, allowing transistors 506 and 507, configured as diodes, to provide bias to gain stage 510 via node A. Similarly, once latch 590 is set, transistor 576 is turned on and transistor 572 is turned off, allowing transistors 556 and 557, configured as diodes, to provide bias to gain stage 510 via node B. Following the setting of latches 540 and 590, the operation of transistors 506, 507, 556, and 557 is similar to transistors 406, 407, 456, and 457, respectively, of FIG. 4. Thus, during phase 2 of the turn-on sequence, bias voltages provided to gain stage 510 are gradually ramped to their respective normal operating levels.

Output stage 330 is shut down in a gradual manner similar to the turn-on sequence. During phase 3 of the turn-off sequence, bias voltages provided to gain stage 510 are gradually ramped back to their respective initial values. At time reference 697, signal OFF0 is asserted and signal ON0 is negated by clock generator circuit 540. Signals OFF0 and ON0 reset latches 540 and 590, respectively, which causes signals SN and SP to be negated. Consequently, transistors 526 and 576 are turned off, isolating bias transistors 506, 507, 556, and 557 from gain stage 510. The assertion of signal OFF0 also turns on transistor 524, allowing current source 525 to begin discharging capacitor 523. As a result, the voltage at node A ramps towards the potential at VSS, gradually turning off transistors 502 and 501.

Similarly, the negation of signal ON0 also turns on transistor 574, allowing current source 575 to begin discharging capacitor 573. As a result, the voltage at node B ramps towards the potential at VDD, gradually turning off transistors 552 and 551. At time reference 698, signal OFF2 is asserted and signal ON2 is negated, which turns on transistors 503 and 553, respectively. Thus, transistors 501 and 551 are turned off. Because transistors 522 and 572 remain on during phase 3 of the turn-off sequence, current source 521 is attempting to charge capacitor 523, and current source 571 is attempting to discharge capacitor 573. Therefore, current sources 525 and 575 are configured to provide approximately twice the amount of current than provided by current sources 521 and 571.

Figure 7:
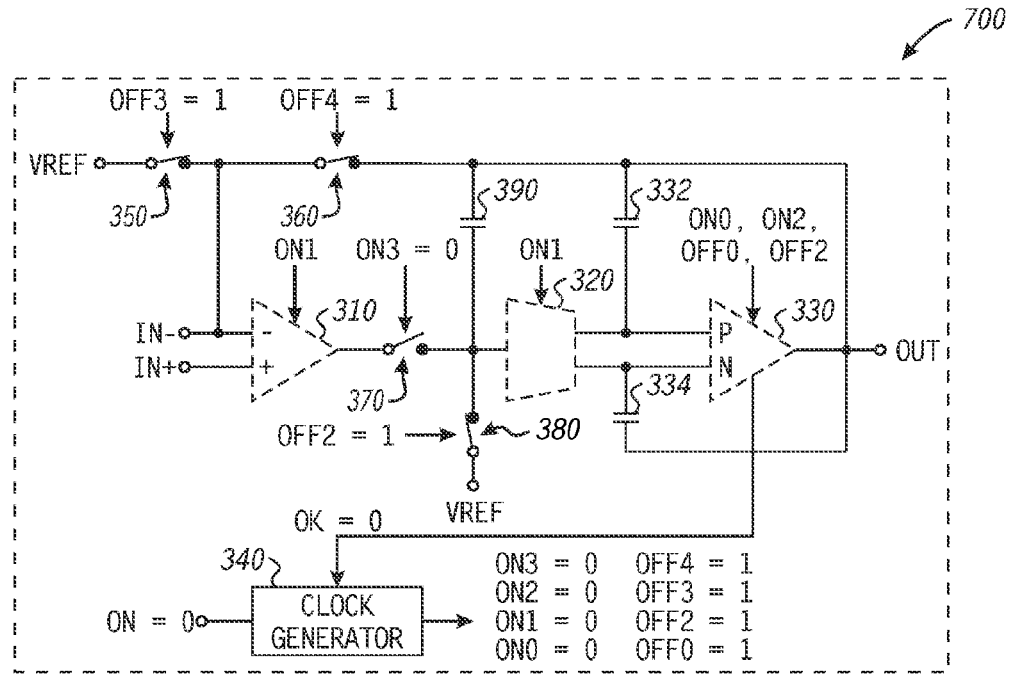
FIG. 7 illustrates in partial block diagram and partial schematic form the audio amplifier of FIG. 3 in an amplifier-off configuration.

FIG. 7 illustrates in partial block diagram and partial schematic form audio amplifier 210 of FIG. 3, in an amplifier-off configuration 700. Configuration 700 corresponds to the interval AMP OFF of FIG. 6. Signals ON0, ON1, ON2, and ON3 are negated, and signals OFF0, OFF2, OFF3, and OFF4 are asserted. Therefore voltage gain stage 310 and transconductance stage 320 are disabled, and biasing at output stage 330 is disabled. In response to the assertion of signal OFF3, switch 350 is closed and signal VREF is connected to the input of voltage gain stage 310. Switch 380 is closed in response to the assertion of signal OFF2, which connects signal VREF to the input of transconductance stage 320.

Switch 360 is closed in response to the assertion of signal OFF4, which provides a short-circuit across external negative feedback devices (not shown) and thereby configures audio amplifier 210 in unity-gain mode. Switch 370 is open in response to the negation of signal ON3, which disconnects the output of voltage gain stage 310 from the input of transconductance stage 320. As previously described, the latches at output stage 330 are reset and gain stage 510 is disabled.

Figure 8:
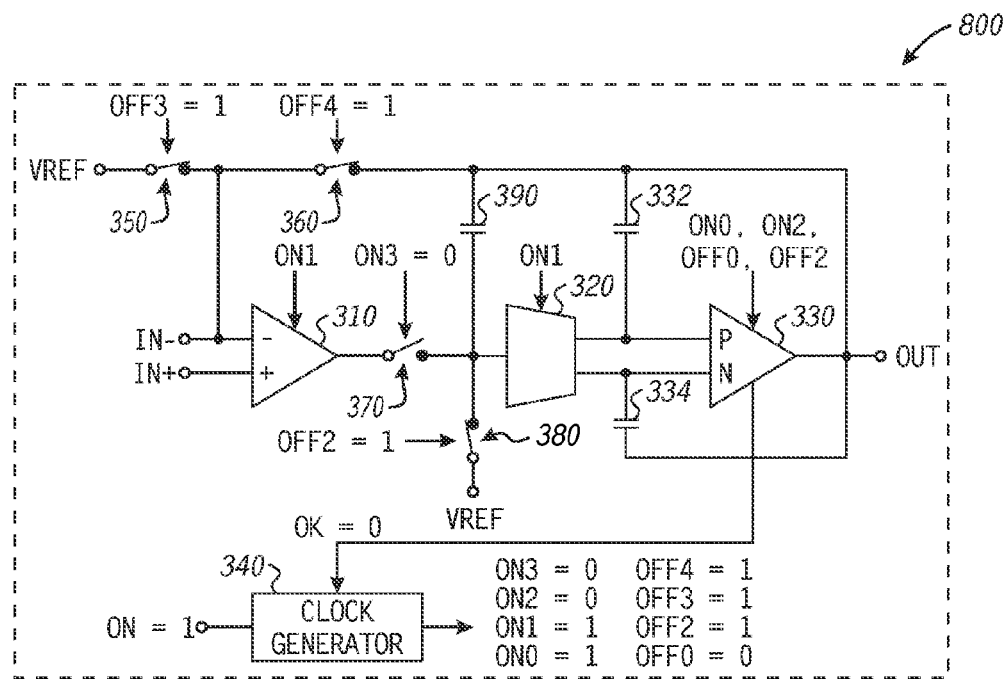
FIG. 8 illustrates in partial block diagram and partial schematic form the audio amplifier of FIG. 3 in a first phase of a power-on sequence.

FIG. 8 illustrates in partial block diagram and partial schematic form audio amplifier 210 of FIG. 3 in a first phase of a power-on sequence, configuration 800. In response to the assertion of signal ON, clock generation circuit 340 asserts signals ON0 and ON1, and negates signals OFF0 and OFF1 at time reference 690. Biasing is thus enabled in voltage gain stage 310 and transconductance stage 320, and allowed to settle.

Figure 9:
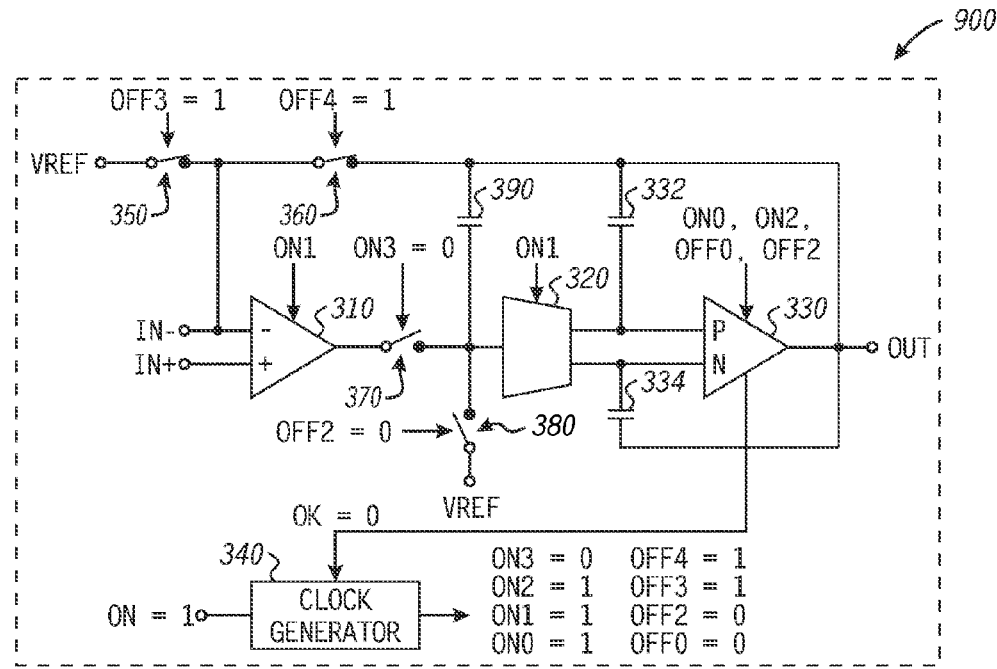
FIG. 9 illustrates in partial block diagram and partial schematic form the audio amplifier of FIG. 3 in a second phase of the power-on sequence.

FIG. 9 illustrates in partial block diagram and partial schematic form audio amplifier 210 of FIG. 3 in a second phase of the power-on sequence, configuration 900. At time reference 691, clock generation circuit 340 asserts signal ON2 and negates signal OFF2. In response to the negation of signal OFF2, switch 380 is opened to release the input of transconductance stage 320. Transconductance stage 320 and output stage 330 together constitute a two-stage amplifier compensated by Miller capacitors 332 and 334. In response to the negation of signal OFF2, bias voltages begin to gradually ramp towards normal operating levels, as previously described with reference to FIG. 5. Turn-on sequence phase 2 ends when the latches at output stage 330 are set and signal OK is asserted.

Figure 10:
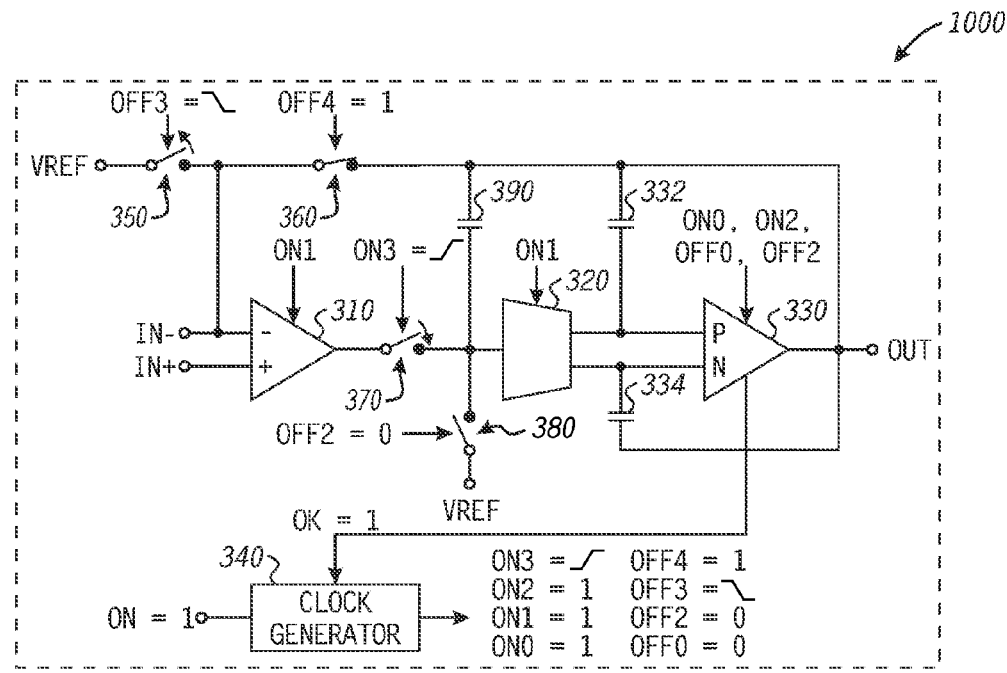
FIG. 10 illustrates in partial block diagram and partial schematic form the audio amplifier of FIG. 3 in a third phase of the power-on sequence.

FIG. 10 illustrates in partial block diagram and partial schematic form audio amplifier 210 of FIG. 3 in a third phase of the power-on sequence, configuration 1000. In response to the assertion of signal OK, clock generation circuit 340 begins ramping signal ON3 from a logic-low level at time reference 692 to a logic-high value at time reference 693, and ramping signal OFF3 from a logic-high to a logic-low value. Audio amplifier 210 smoothly transitions from a two-stage to a three-stage configuration as switch 370 is gradually closed. Switch 350, 360, and 370 can gradually transition from an open to a closed configuration by providing decreasing resistance to current between the switch terminals in a suitable proportion to the voltage level of the activating control signal. Similarly, switches 350, 360, and 370 can gradually transition from a closed to an open configuration by providing increasing resistance to current between the switch terminals in a suitable proportion to the voltage level of the activating control signal. For example, as signal ON3 ramps up during turn-on sequence phase 3, the conductivity of switch 370 slowly decreases until a direct low-resistance connection is established. Similarly, as signal OFF3 ramps down, switch 350 is gradually opened, which disconnects reference signal VREF from the input of input stage 310 and from the output of output stage 330.

Figure 11:
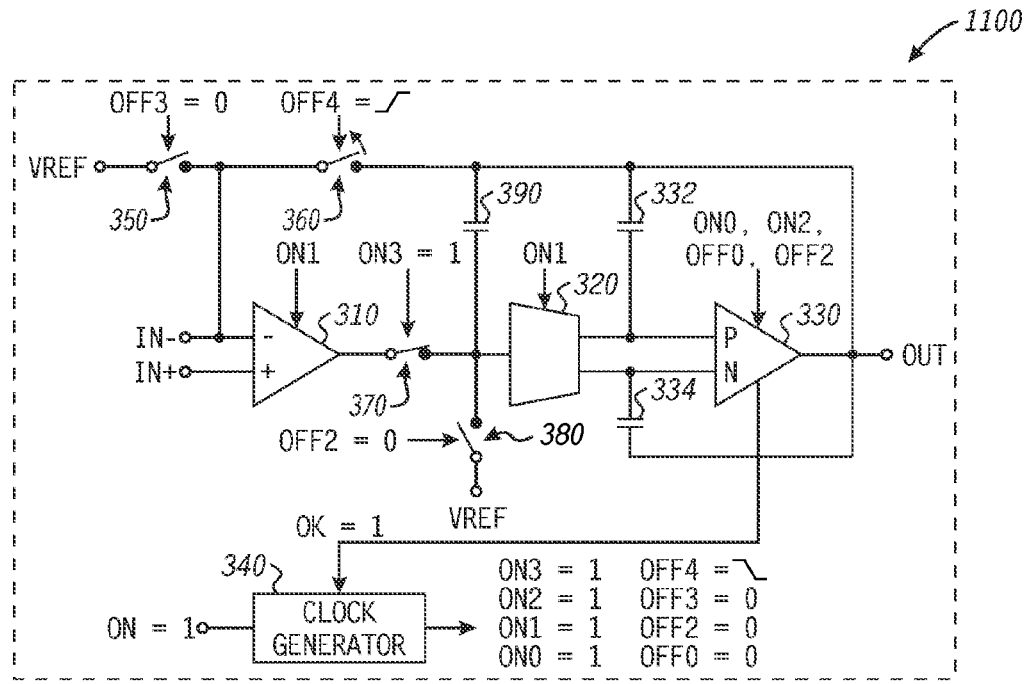
FIG. 11 illustrates in partial block diagram and partial schematic form the audio amplifier of FIG. 3 in a fourth phase of the power-on sequence.

FIG. 11 illustrates in partial block diagram and partial schematic form audio amplifier 210 of FIG. 3 in a fourth phase of the power-on sequence, configuration 1100. At time reference 693, signal OFF4 begins ramping from a logic-high value to a logic-low value at time reference 694. In response to the ramp of signal OFF4, switch 360 is gradually opened, and audio amplifier 210 gradually exits unity-gain mode.

Figure 12:
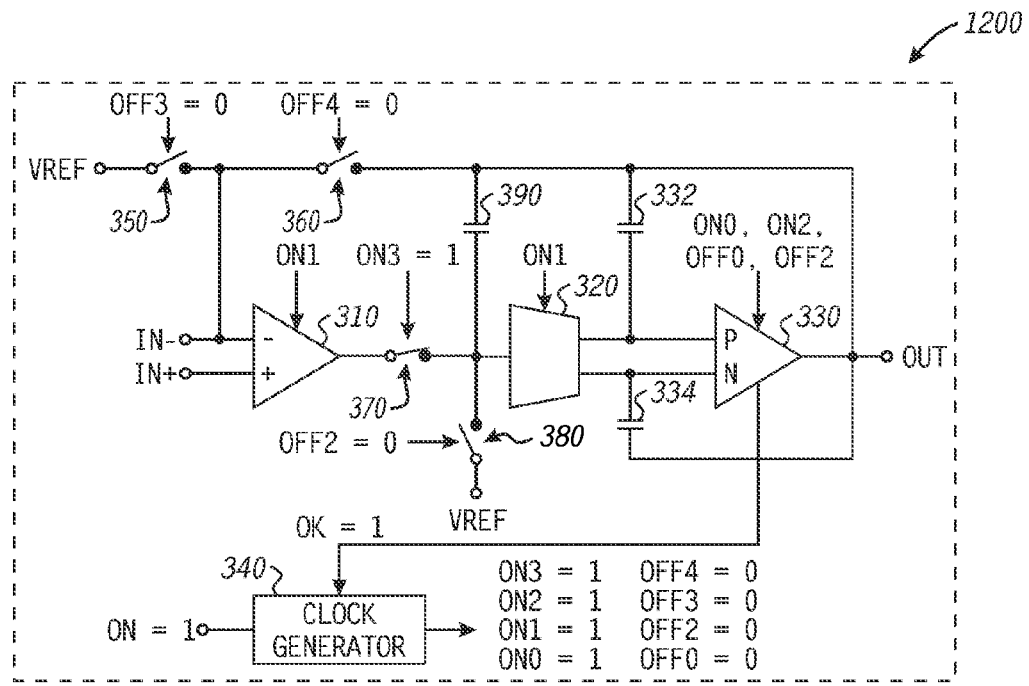
FIG. 12 illustrates in partial block diagram and partial schematic form the audio amplifier of FIG. 3 after the power-on sequence has completed.

FIG. 12 illustrates in partial block diagram and partial schematic form audio amplifier 210 of FIG. 3 in configuration 1200 after the power-on sequence has completed. Switch 360 is fully open at the end of phase 4, and audio amplifier 210 is fully operational.

Figure 13:
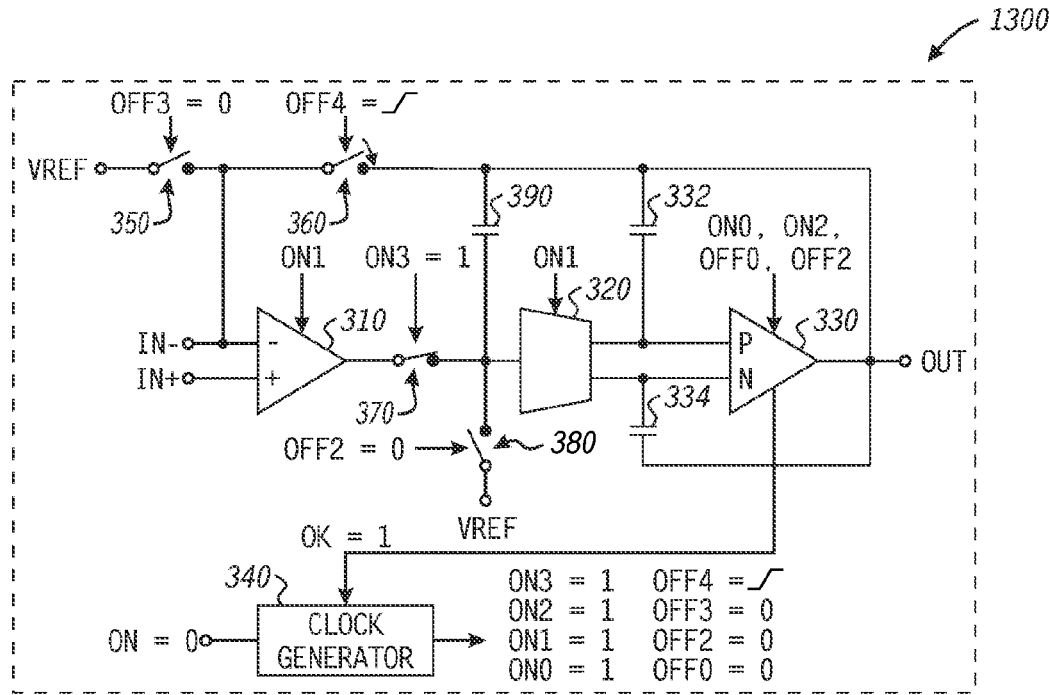
FIG. 13 illustrates in partial block diagram and partial schematic form the audio amplifier of FIG. 3 in a first phase of a power-off sequence.

FIG. 13 illustrates in partial block diagram and partial schematic form audio amplifier 210 of FIG. 3 in a first phase of a power-off sequence, configuration 1300. At time reference 695, signal ON is negated, and clock generation circuit 340 responds by ramping signal OFF4 from a logic-low value to a logic-high value at time reference 696, gradually placing audio amplifier 210 back into a unity-gain mode.

Figure 14:
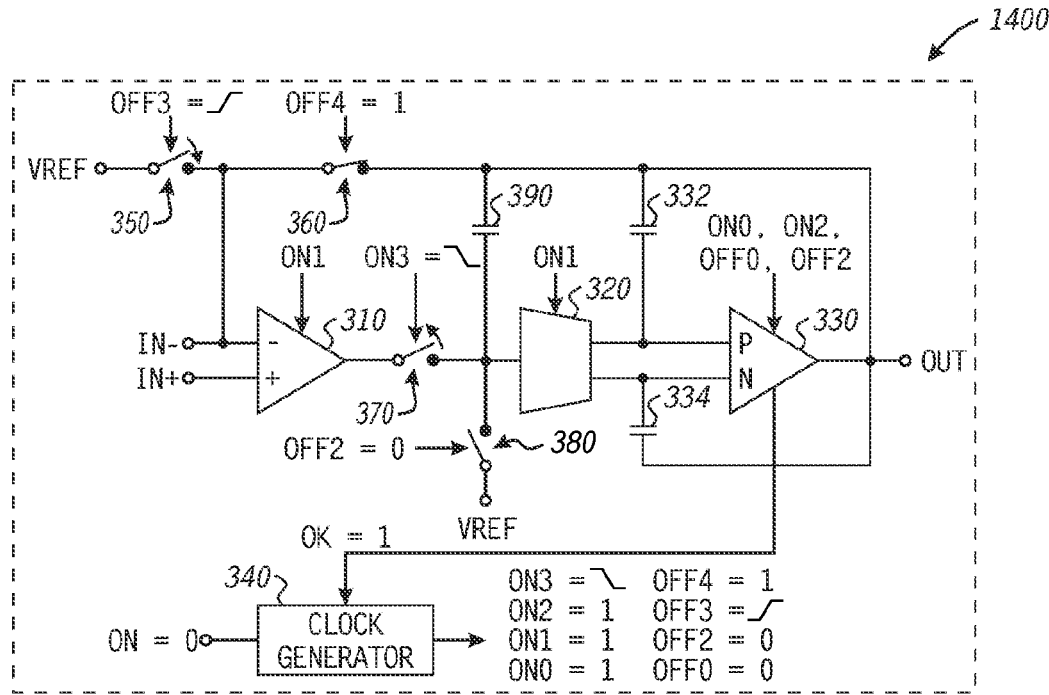
FIG. 14 illustrates in partial block diagram and partial schematic form the audio amplifier of FIG. 3 in a second phase of the power-off sequence.

FIG. 14 illustrates in partial block diagram and partial schematic form audio amplifier 210 of FIG. 3 in a second phase of the power-off sequence, configuration 1400. At time reference 696, clock generation circuit 340 begins ramping signal OFF3 from a logic-low value to a logic-high value at time reference 697, and ramping signal ON3 from a logic-high value to a logic-low value. Switch 350 is gradually closed in response to signal OFF3 and connects signal VREF to input IN−. Switch 370 is gradually opened in response to signal ON3 to disconnect the output of voltage gain stage 310 from the input of transconductance stage 320.

Figure 15:
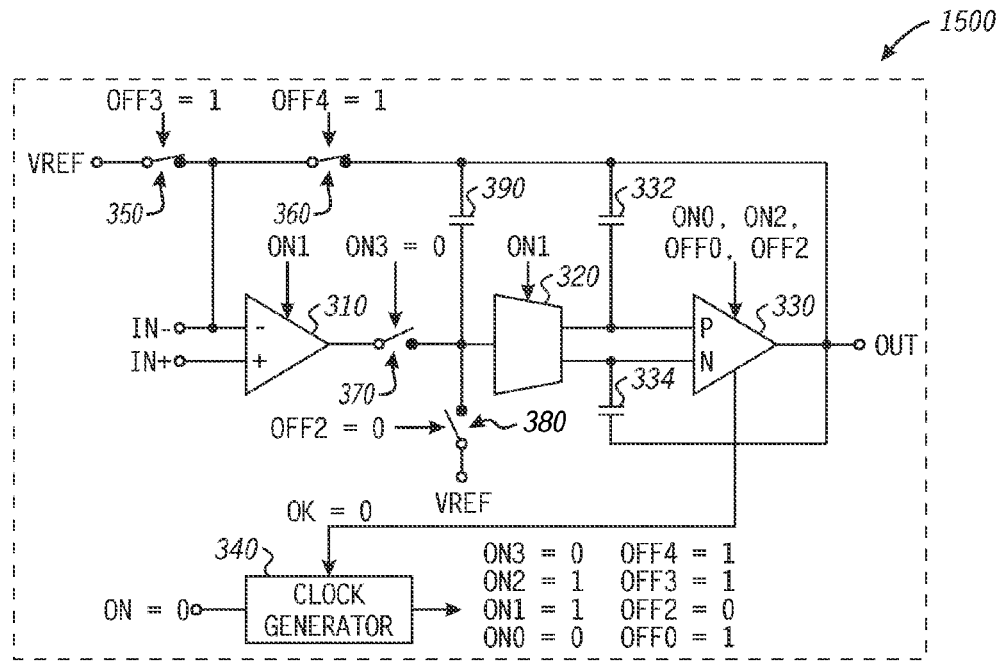
FIG. 15 illustrates in partial block diagram and partial schematic form the audio amplifier of FIG. 3 in a third phase of the power-off sequence.

FIG. 15 illustrates in partial block diagram and partial schematic form audio amplifier 210 of FIG. 3 in a third phase of the power-off sequence, configuration 1500. At time reference 697, clock generation circuit 340 negates signal ON0 and asserts signal OFF0. In response, latches 540 and 590 of output stage 330 are reset, and current sources 525 and 575 begin to gradually ramp the bias voltage at nodes A and B towards VSS and VDD, respectively, and gain stage 510 is gradually turned off. At time reference 698, bias voltages at gain stage 510 are once again at their respective initial (off) value.

Figure 16:
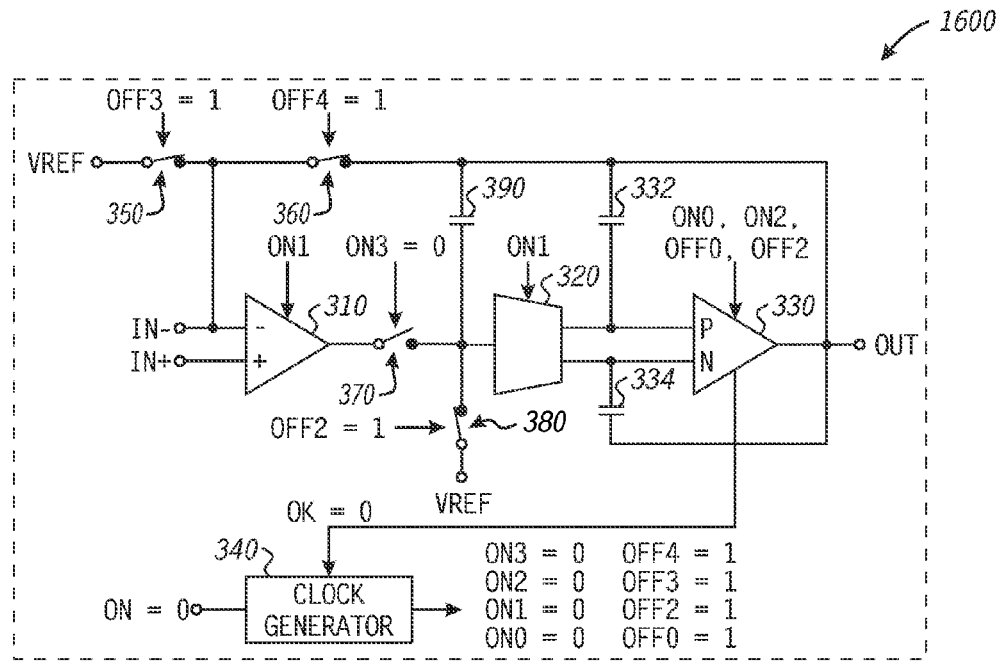
FIG. 16 illustrates in partial block diagram and partial schematic form the audio amplifier of FIG. 3 in a fourth phase of the power-off sequence.

FIG. 16 illustrates in partial block diagram and partial schematic form audio amplifier 210 of FIG. 3 in a fourth phase of the power-off sequence, configuration 1600. At time reference 698, clock generation circuit 340 asserts signal OFF2 and negates signals ON2 and ON1. In response, transistors 503 and 533 of gain stage 510 are turned off, and voltage gain stage 310 and transconductance stage 320 is disabled. Furthermore, the assertion of signal OFF2 closes switch 380, which discharges capacitor 390.

Figure 17:
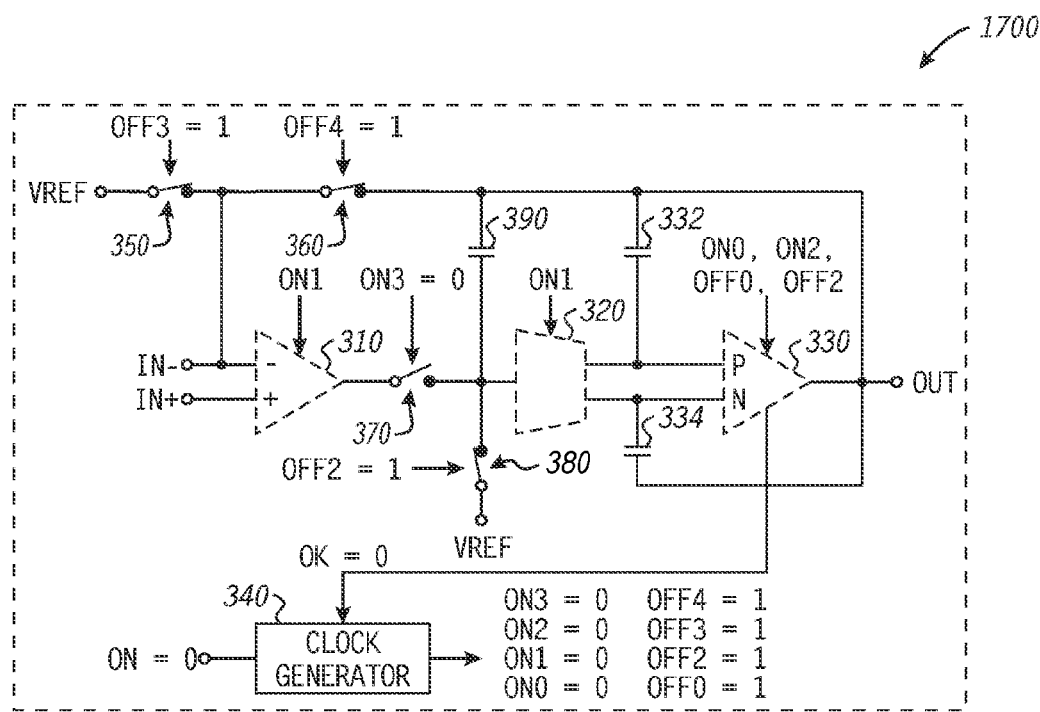
FIG. 17 illustrates in partial block diagram and partial schematic form the audio amplifier of FIG. 3 after completion of the power-off sequence.

FIG. 17 illustrates in partial block diagram and partial schematic form audio amplifier 210 of FIG. 3 after completion of the power-off sequence, configuration 1700. At time reference 699, audio amplifier 210 is turned off, and in the same configuration illustrated in FIG. 7. Performing the previously described turn-on sequence can reactivate audio amplifier 210.

Gradually ramping the bias voltages provided to gain stage 510 during the turn-on and the turn-off sequence can substantially eliminate transients at output node OUT. The circuit techniques and methods disclosed herein can also be applied to amplifiers operating outside of the typical audio frequency spectrum, including radio frequency, subsonic frequency, and direct-current signals. Furthermore, methods described herein can be applied to current amplifiers, voltage amplifiers, and amplifiers belonging to another class. For example, bias voltages can be ramped as described to turn on and turn off class G, class H, or another type of amplifier. While the disclosed methods are illustrated using insulated gate metal oxide semiconductor (IGMOS) transistor devices, other transistor technologies, such as bipolar, can be substituted. Bias currents, as opposed to bias voltages, can be ramped to support particular implementation variations. The techniques described can also be applied to amplifiers incorporating vacuum-tube devices.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. An amplifier comprising:
an input stage having an input for receiving an input signal, and an output; and
an output stage having an input coupled to said output of said input stage, and an output for providing an amplified output signal,
wherein said output stage comprises:
a gain stage having an input forming said input of said output stage, an output for providing said amplified output signal, and first and second bias terminals,
wherein said gain stage comprises:
a first transistor having a first current electrode coupled to a first power supply voltage terminal, a control electrode forming a first differential input terminal of said gain stage, and a second current electrode coupled to said output of said gain stage;
a second transistor having a first current electrode coupled to said second current electrode of said first transistor, a control electrode forming a second differential input terminal of said gain stage, and a second current electrode coupled to a second power supply voltage terminal;
a third transistor having a first current electrode coupled to said control electrode of said first transistor, a control electrode forming said first bias terminal of said gain stage, and a second current; and
a fourth transistor having a first current, a control electrode forming a second bias terminal of said gain stage, and a second current electrode coupled to said control electrode of said second transistor; and
a bias circuit having a first and second output terminals coupled to said first and second bias terminals of said gain stage, wherein during a turn-on period said bias circuit gradually ramps said first and second bias terminals from respective first and second initial voltages to respective first and second bias voltages.

2. The amplifier of claim 1 wherein during a turn-off period, said bias circuit gradually ramps said first and second bias terminals of said gain stage from said respective first and second bias voltages to said respective first and second initial voltages.

3. The amplifier of claim 1 wherein said input stage comprises:
a voltage gain stage having an input terminal for receiving said input signal, and an output terminal; and
a transconductance stage having an input terminal coupled to said output terminal of said voltage gain stage, and an output terminal coupled to said input of said output stage.

4. The amplifier of claim 1 wherein said first and third transistors comprise P-channel MOS transistors, and said second and fourth transistors comprise N-channel MOS transistors.

5. An audio amplifier comprising:
a voltage gain stage having an input terminal for receiving an audio input signal, and an output terminal;
a transconductance stage having an input terminal selectively coupled to said output terminal of said voltage gain stage, a first output terminal, and a second output terminal; and a class AB output stage having a first and second input terminals respectively coupled to said first and second output terminals of said transconductance stage, first and second bias terminals, and an output terminal for providing an amplified audio output signal, wherein said class AB output stage is inoperative when a voltage at first and second bias terminals are at first and second initial voltages, and said class AB output stage clamps voltages at said first and second input terminals to respective clamp voltages when said first and second bias terminals are equal to first and second bias voltages, respectively, and comprising a bias circuit for gradually ramping said first and second bias terminals from corresponding initial voltages to corresponding bias voltages.

6. The audio amplifier of claim 5 further comprising a clock generator circuit having an input terminal for receiving an ON signal, and output terminals coupled to said bias circuit and responsive to said ON signal for defining a plurality of phases of the audio amplifier.

7. The audio amplifier of claim 6 wherein said clock generator defines a first phase of the audio amplifier for biasing first and second terminals of a first capacitor to a first reference voltage and coupling said output terminal of said class AB output stage to the input terminal of said voltage gain stage.

8. The audio amplifier of claim 7 wherein said clock generator defines a second phase subsequent to said first phase during which said bias circuit gradually ramps said first and second bias terminals from said corresponding initial voltages to said corresponding bias voltages.

9. The audio amplifier of claim 8 wherein during said second phase said clock generator couples said first capacitor between said output terminal of said class AB output stage and said input terminal of said transconductance stage.

10. The audio amplifier of claim 8 wherein said bias circuit further comprises a ramp detection circuit for detecting that said first and second bias terminals are both substantially at said respective first and second bias voltages, and providing an OK signal in response thereto.

11. The audio amplifier of claim 10 wherein during a third phase subsequent to said second phase said clock generator couples said output terminal of said voltage gain stage to said input terminal of said transconductance stage.

12. The audio amplifier of claim 11 wherein during a fourth phase subsequent to said third phase said clock generator decouples said output terminal of said class AB output stage from said input terminal of said voltage gain stage.

13. The audio amplifier of claim 12 wherein during said fourth phase said clock generator gradually decouples said output terminal of said class AB output stage from said input terminal of said voltage gain stage.

14. A method of turning on an audio amplifier having a class AB output stage to reduce audible transients comprising:
biasing a first output transistor to be nonconductive in response to a first bias signal being at a first initial voltage, and to provide a voltage to an output terminal of the class AB output stage proportional to a voltage received at a control electrode thereof in response to said first bias signal being at a first bias voltage;
biasing a second output transistor to be nonconductive in response to a second bias signal being at a second initial voltage, and to provide a voltage to said output terminal of the class AB output stage proportional to a voltage received at a control electrode thereof in response to said second bias signal being at a second bias voltage;

gradually ramping said first bias signal from said first initial voltage to said first bias voltage;

gradually ramping said second bias signal from said second initial voltage to said second bias voltage; and subsequently enabling an operation of the audio amplifier.

15. The method of claim 14 further comprising:

biasing first and second terminals of a first capacitor to a first reference voltage and coupling an output terminal of the audio amplifier to an input terminal of the audio amplifier during a first phase of the audio amplifier.

16. The method of claim 15 further comprising:

coupling said output terminal of the audio amplifier to said input terminal of the audio amplifier and to a reference voltage terminal during said first phase of the audio amplifier.

17. The method of claim 16 wherein:

gradually ramping said first and second bias signals from said first and second initial voltages, respectively, to said first and second bias voltages, respectively, during a second phase subsequent to said first phase.

18. The method of claim 17 further comprising:

detecting that said first and second bias terminals are both substantially at said first and second bias voltages, respectively, and initiating a third phase subsequent to said second phase in response thereto.

19. The method of claim 18 further comprising:

decoupling said output terminal of the audio amplifier from said reference voltage terminal during said third phase.

20. The method of claim 19 further comprising:

decoupling said output terminal of the audio amplifier from said input terminal of the audio amplifier during a fourth phase subsequent to said third phase.

21. The method of claim 20 wherein said decoupling said output terminal of the audio amplifier from said input terminal of the audio amplifier comprises:

gradually decoupling said output terminal of the audio amplifier from said input terminal of the audio amplifier during said fourth phase.

22. The amplifier of claim 1 wherein:

said second current electrode of said third transistor is coupled to said control electrode of said second transistor; and said first current electrode of said fourth transistor is coupled to said control electrode of said first transistor.

* * * * *

UNITED STATES PATENT AND TRADEMARK OFFICE
CERTIFICATE OF CORRECTION

PATENT NO. : 8,471,628 B2  
APPLICATION NO. : 13/120143  
DATED : June 25, 2013  
INVENTOR(S) : Marc Henri Ryat Page 1 of 1

It is certified that error appears in the above-identified patent and that said Letters Patent is hereby corrected as shown below:

In the Specification:

In column 6, line 45, replace "drain," with "drain.".

In column 6, line 61, replace "OFF 2," with "OFF2,".

In column 6, line 63, replace "re-channel" with "n-channel".

Signed and Sealed this
Twenty-fourth Day of September, 2013

Teresa Stanek Rea
*Deputy Director of the United States Patent and Trademark Office*